(12) United States Patent
Nakazato

(10) Patent No.: US 6,760,273 B2
(45) Date of Patent: Jul. 6, 2004

(54) BUFFER USING TWO-PORT MEMORY

(75) Inventor: Satoshi Nakazato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/338,830

(22) Filed: Jan. 9, 2003

(65) Prior Publication Data

US 2003/0128620 A1 Jul. 10, 2003

(30) Foreign Application Priority Data

Jan. 10, 2002 (JP) .................................. 2002-003964

(51) Int. Cl.[7] ............................................. G11C 8/00

(52) U.S. Cl. ........................ 365/230.05; 365/189.12; 365/230.06

(58) Field of Search ................... 365/230.05, 189.12, 365/230.06, 189.01, 189.11

(56) References Cited

U.S. PATENT DOCUMENTS 6,104,663 A * 8/2000 Kablanian ............... 365/230.05

* cited by examiner

Primary Examiner—David Lam
(74) Attorney, Agent, or Firm—McGinn & Gibb, PLLC

(57) ABSTRACT

A buffer is provided that has a high access time and operates with reduced power consumption. The buffer includes n write word line registers (40_0), each of which an output is directly connected to a word line driver. Thus, a word line is driven to access a memory cell array. All the word line registers are cascaded in a ring form. The write START signal 41 acting as a synchronous set input is input to the write word line register (40_0) corresponding to the least significant address. The write strobe (STB) signal 42 is input to the write word line registers connected in a ring form. When the write strobe signal 42 is active, the write word line registers operate like a shift register. When the write strobe signal 42 is not active, all the write word line registers hold a current value.

12 Claims, 6 Drawing Sheets

START

10: MEMORY CELL
21, 31: BIT LINE
42: STROBE SIGNAL
600: WRITE ADDRESS REGISTER
650: READ ADDRESS REGISTER
640_0: WRITE ADDRESS DECODER
660_0: READ ADDRESS DECODER
50_0, 70_0: WORD LINE DRIVER
51_0: WORD LINE (WRITE)
601: INCREMENTER
71_0: WORD LINE (READ)

BUFFER USING TWO-PORT MEMORY

BACKGROUND OF THE INVENTION

The present invention relates to a buffer using a two-port memory. More particularly, the present invention relates to a buffer with a two-port memory, which aims at a high-speed access time when being used as a buffer.

In the related art, two-port RAMs each having a first port acting as a write port and a second port acting as a read port are quoted. The two-port RAM is used as a buffer that counts up an address value in each port with a corresponding strobe signal, stores sets of data arrived for a given period, and transmits each set of data in the arrival order in accordance with a request.

The RAM includes an address decoder, memory cells arranged two-dimensionally, a signal amplifier circuit corresponding to writing, and a signal amplifier circuit corresponding to reading. The RAM specifies a line of memory cells corresponding to a specific address specified by the address decoder. One of drive lines (called a word line) provided for respective lines of memory cells is activated to select the memory cells on the selected line.

That process is performed by a three-step procedure. That is, the three-step procedure includes the steps of reading an address value from an address register every time a memory cell is accessed, decoding the address until a word line driven from the address value is specified, and driving only one word line to an active state. In the steps, the sum of respective delay times represents an access time to a memory cell.

FIG. 6 is a block diagram illustrating a related-art buffer using a two-port RAM. A memory cell array 10, which includes memory cells arranged two-dimensionally (in a matrix form), forms a storage element area. In order to access a specific memory cell in the memory cell array 10, column selection lines (generally called word lines) and row selection lines (generally called bit lines) are arranged in a matrix form. Generally, one of the word lines is specifically activated by the address provided to the RAM. The associated bit line transmits data provided to the RAM, to a memory cell.

Referring to FIG. 6, the RAM has one read port and one write port. The two-ports can operate simultaneously and independently. The two-port RAM includes n word lines ($51\_0, 51\_1, 51\_2, \ldots, 51\_n-1, 51\_n$) corresponding a write address, n word lines ($71\_0, 71\_1, 71\_2, \ldots, 71\_n-1, 71\_n$) corresponding to a read address, a bit line 21 corresponding to write data, and a bit line 31 corresponding to read data.

FIG. 6 shows one bit line 21 for write data and one bit line 31 for read data. However, there are actually bit lines corresponding to the number of bits. Generally, the differential transmission is performed that transmits one bit using a pair of bit lines for positive logic and negative logic. Actually, the number of bit lines is twice the number of bits.

Next, the operation of the conventional buffer having a two-port RAM shown in FIG. 6 will be explained below.

First, an initial value, being generally all 0 data, is set to the write address register 600. However, a certain value may be set as an initial value to set an offset starting a write operation from a specific address. Here, it is assumed that all 0 data are set to the write address register. Each of the write address decoders ($640\_0, 640\_1, 640\_2, \ldots, 640\_n-1, 640\_n$) decodes the address value set to the write address register 600. Only the address decoder in coincidence with an address value outputs an active result. In the initial state where the address value is of all 0s, only the address decoder ($640\_0$) corresponding to the least significant address outputs an active result.

The word line drivers ($50\_0, 50\_1, 50\_2, \ldots, 50\_n-1, 50\_n$) respectively reinforce the drive capability of the outputs of the write address decoders ($640\_0, 640\_1, 640\_2, \ldots, 640\_n-1, 640\_n$) and then drive the word lines ($51\_0, 51\_1, 51\_2, \ldots, 51\_n-1, 51\_n$). Actually, only the word line connected to the address decoder outputting an active result is driven. In an initial state, only the word line ($51\_0$) driven by the word line driver ($50\_0$) corresponding to the least significant address becomes a valid selection state.

On the other hand, the write data stored in the write data register 20 is sent to each memory cell through the bit line 21. In the initial state, since the word line ($50\_0$) corresponding to the least address is in a selection state, the data in the write data register 20 is written into the memory cell of the least significant address.

The incrementer 601, connected to the output of the write address register 600, counts up the address. The count-up address value is again fed back to the input of the write address register 600. The write address register 600 captures the count-up address only when the strobe signal 42 is in an active state. When the strobe signal 42 is not an active state, the write address register 600 continues to hold the counted-up value. Therefore, only when the strobe signal 42 is in an active state, the write address value is counted up. At the same time, the strobe signal 42 controls the data capture to the write data register 20. Simultaneously when the write address value is counted up, a new write data value is captured into the write data register 20.

In doing so, when the strobe signal 42 is in an active state, the write address value is counted up. As a result of address decoding, the word line driven to an effective selection state is sequentially changed in the increasing order from the least significant address. At the same time, since the write data is updated sequentially, newer write data is stored into an upper address. At the time when the write address value becomes an all "1s" state, the status reaches the most significant address. Thereafter, when being counted up with the strobe signal, the write address value is reset to an all "0s" state, so that the data of the least significant address is overwritten. Thus, the ring data buffer that can store sets of data corresponding to the number of addresses of the RAM is configured.

That is also the case for the operation of the reading side. After the address value stored in the read address register 650 is decoded by the read address decoders ($660\_0, 660\_1, 660\_2, \ldots, 660\_n-1, 660\_n$), the word lines ($71\_0, 71\_1, 71\_2, \ldots, 71\_n-1, 71\_n$) are respectively driven through the word line drivers ($70\_0, 70\_1, 70\_2, \ldots, 70\_n-1, 70\_n$). As a result, data in the memory cell of a corresponding address is read out and is input to the read data register 30 through the bit line 31. The incrementer 651, connected to the output of the read address register 650, counts up the read address. When the strobe signal 62 is in an active state, the incrementer 651 updates the content of the read address register 650 and the content of the read data register 30. In doing so, when the strobe signal is in an active state on the reading side, the data stored in the memory cells are sequentially read out to upper addresses from the least significant address. After the data of the most significant address is read out, the operation returns to the least significant address to read data again.

As described above, in the operation of the conventional buffer using a two-port memory, the writing side is first operated to store data to memory cells. After it is ascertained that data have been stored until a specified address, the operation of the reading side begins. When the operation of the reading side begins, the buffer is controlled using only the strobe signal 42 on the reading side and the strobe signal 62 on the writing side.

However, in the above-mentioned buffer (with a two-port RAM), only by sequentially counting up the read address or the write address with the strobe signal, the word line to be activated is sequentially changed from the least significant address to the most significant address. The problem is it is inefficient to provide address decoders corresponding to word line drivers, which are activated sequentially.

Moreover, the conventional buffer has the problem in that the time period for reading an address value from the address register and then driving the word line after address decoding is taken largely.

Moreover, in the conventional two-port RAM, the address signal must be decoded every time the address is counted up by a strobe signal. For that reason, the problem is that the power consumed by the address decoders becomes wasteful.

SUMMARY OF THE INVENTION

The present invention is made to solve the above-mentioned problems. An object of the present invention is to provide a buffer using a two-port memory, which has a high-speed access time and which can operate with reduced power consumption.

In an aspect of the present invention, a buffer using a two-port memory comprises a memory cell array formed of memory cells arranged two-dimensionally in a matrix form; a plurality of write-word lines arranged corresponding to a write address; a plurality of read-word lines arranged corresponding to a read address; a plurality of write bit lines arranged corresponding to write data; a plurality of read bit lines arranged corresponding to read data; a plurality of word line registers arranged corresponding to either the write word lines or the read word lines; a plurality of word line drivers respectively connected directly to outputs of the word line registers, for respectively driving the word lines; a write data register connected to the write bit lines; and a read data register connected to the read bit line; the word line registers being mutually cascaded in a ring form, to receive a strobe signal; whereby each of the word line registers counts up its input when the strobe signal is in an active state and holds a current value when the strobe signal is not in an active state.

In another aspect of the present invention, a buffer using a two-port memory, comprises a memory cell array formed of memory cells arranged two-dimensionally in a matrix form; a plurality of write-word lines arranged corresponding to a write address; a plurality of read-word lines arranged corresponding to a read address; a plurality of write bit lines arranged corresponding to write data; a plurality of read bit lines arranged corresponding to read data; a plurality of write word line registers arranged corresponding to the write word lines; a plurality of read word line registers arranged corresponding to the read word lines; a plurality of write word line drivers for directly receiving outputs of the write word line registers, for driving the write word lines; a plurality of read word line drivers for directly receiving outputs of the read word line registers and driving the read word lines; a write data register connected to the write bit lines; and a read data register connected to the read bit line; the write word line registers being mutually cascaded in a ring form, to receive a write strobe signal; whereby each of the write word line registers counts up an input when the write strobe signal is in an active state and holds a current value when the write strobe signal is not in an active state; the read word line registers being mutually cascaded in a ring form, to receive a read strobe signal; whereby each of the read word line registers counts up an input when the read strobe signal is in an active state and holds a current value when the read strobe signal is not in an active state.

In the buffer according to the present invention, the write strobe signal is used to controllably update the write data register. The read strobe signal is used to controllably update the read data register. The write data register updates write data when the write strobe signal is in an active state. The read data register updates read data when the read strobe signal is in an active state. The write data register hold a current value when the write strobe signal is not in an active state. The read data register hold a current value when the read strobe signal is not in an active state.

In the buffer according to the present invention, a write word line register corresponding to a specific address receives a write START signal as a synchronous set input. A read word line register corresponding to a specific address receives a read START signal as a synchronous set input.

According to the present invention, the buffer further comprises a write address initial value register for storing a write address initial value; a write address initial value decoder for decoding a write address initial value stored in the write address initial value register; a plurality of AND logic circuits for creating a synchronous set signal to the write word line register in accordance with plural decode addresses from the write address initial value decoder and in accordance with a write START signal; a read address initial value register for storing a read address initial value; a read address initial value decoder for decoding a read address initial value stored in the read address initial value register; and a plurality of AND logic circuits for creating a synchronous set signal to the read word line register in accordance with plural decode addresses from the read address initial value decoder and in accordance with a read START signal.

According to the present invention, the buffer further comprises a write delay register, which forms a leading edge differentiation circuit, for detecting rising when a write word line register of a most significant address is in an active state and then creating one clock pulse; an AND logic circuit with write negative inputs, having an inversion input terminal which receives an output of the write delay register and a normal input terminal which receives an output of the write word line register of the most significant address; a write exclusive OR logic circuit forming a write address carry flag for toggling one clock pulse as an input; a write flag register for receiving an output of the write exclusive OR logic circuit; a read delay register forming a read differentiation circuit that detects rising when a read word line register of the most significant address becomes an active state and then creates one clock pulse; an AND logic circuit with read negative inputs, having an inversion input terminal for receiving an output of the read delay register and a normal input terminal for receiving an output of the read word line register of the most significant address; a read exclusive OR logic circuit forming a read address carry flag toggling one clock pulse as an input; a read flag register for receiving an output of the read exclusive OR logic circuit; a plurality of coincidence detection AND logic circuits each for detecting whether or not a value held in each write word line register coincides with a value held in each read word line register;

an OR logic circuit for detecting whether or not there is a coincidence result in any one of the coincidence detection AND logic circuit; an exclusive OR logic circuit and an AND logic circuit, for detecting a buffer overflow when a write address carry flag is not in coincident with a read address carry flag and when the OR logic circuit produces a coincidence result; and an exclusive NOR logic circuit and an AND logic circuit, for detecting a buffer underflow when a write address carry flag is in coincident with a read address carry flag and when the OR logic circuit produces a coincidence result.

According to the present invention, the importance of the fact that the write address and the read address are counted up with the strobe signal is recognized in the method of using a two-port RAM as a buffer. Thus, the address decoders (each acting as a RAM) in the two systems used in the prior art are removed. Conventionally, the access time to the buffer, during which data is read by accessing a RAM cell from the address register via the address decoder, is required. However, in the present invention, the delay time in the address decoder is cut, so that the buffer can realize its high-speed operation.

Moreover, the present invention can reduce the power consumption of the address decoder, thus operating the entire system with reduced power. Several buffers or tens of buffers are often used per specific chip. In such a case, the buffer according to the present invention can effectively reduce the power consumption per chip.

BRIEF DESCRIPTION OF THE DRAWINGS

This and other objects, features and advantages of the present invention will become more apparent from the following detailed description taken in conjunction with the attached drawings, in which.

DESCRIPTION OF THE EMBODIMENTS

A buffer according to the present invention will be described below in detail by referring to the attached drawings.

Figure 1:
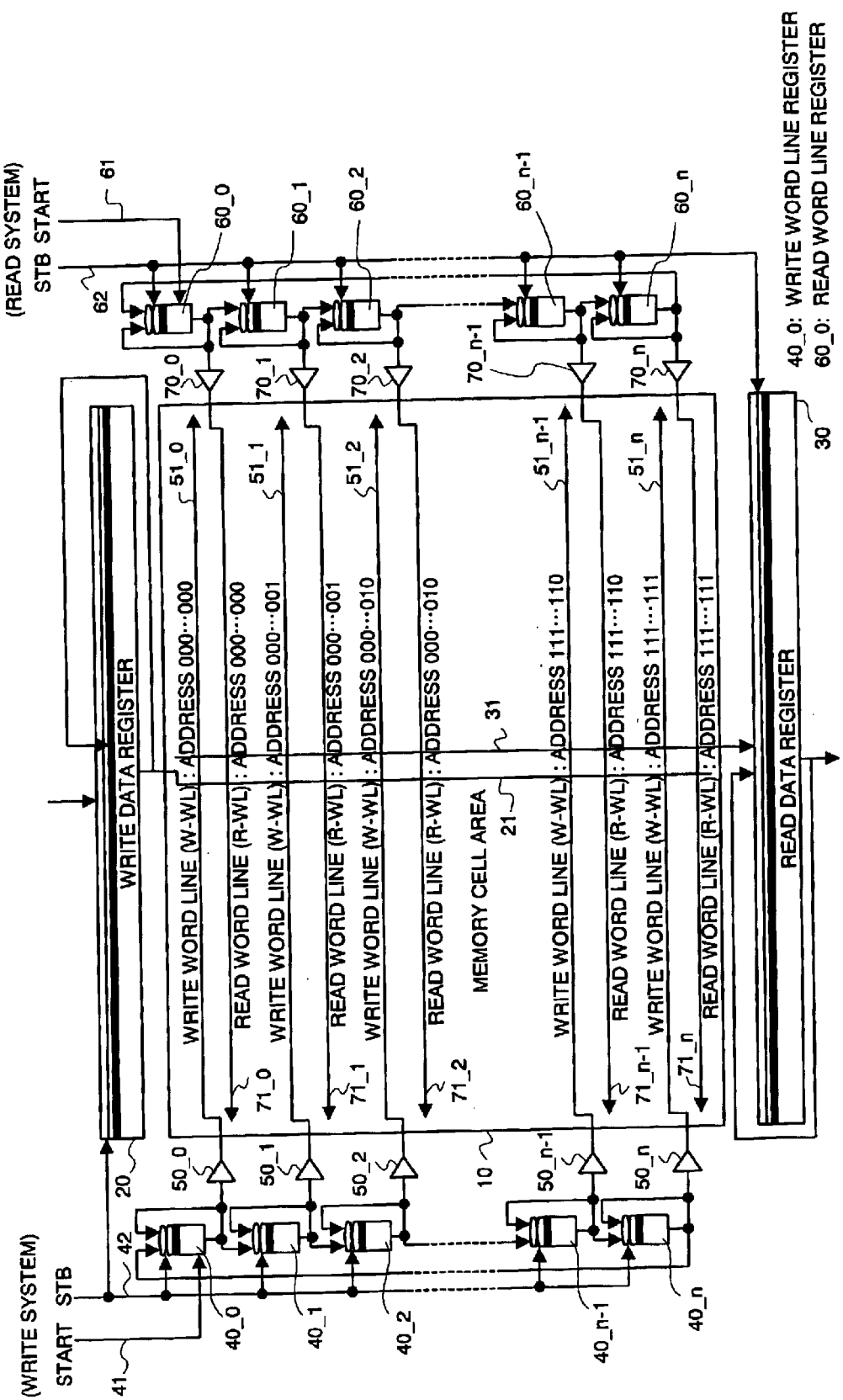
FIG. 1 is a block diagram illustrating a buffer circuit using a two-port RAM, according to a first embodiment of the present invention.

FIG. 1 is a block diagram illustrating a two-port RAM according to a first embodiment of the present invention. In order to form a storage element area, memory cells are arranged in a two-dimensional matrix form within the memory cell array 10. The memory cell array 10 has a read port and a write port, which are operable simultaneously and respectively. The memory cell array 10 includes n word lines (51_0, 51_1, 51_2, ..., 51_$n$–1, 51_$n$) corresponding to a write address, n word lines (71_0, 71_1, 71_2, ..., 71_$n$–1, 71_$n$) corresponding to a read address, bit lines 21 corresponding to write data, and bit lines 31 corresponding to read data. FIG. 1 shows one bit line 21 for write data and one bit line 31 for read data. However, bit lines corresponding to the number of bits are actually prepared. Generally, the differential transmission of transmitting one bit by means of a pair of bit lines for positive logic and negative logic is often performed. Actually, the number of bit lines is twice the number of bits. Such a configuration is well known and is not illustrated for simplified drawings.

Figure 6:
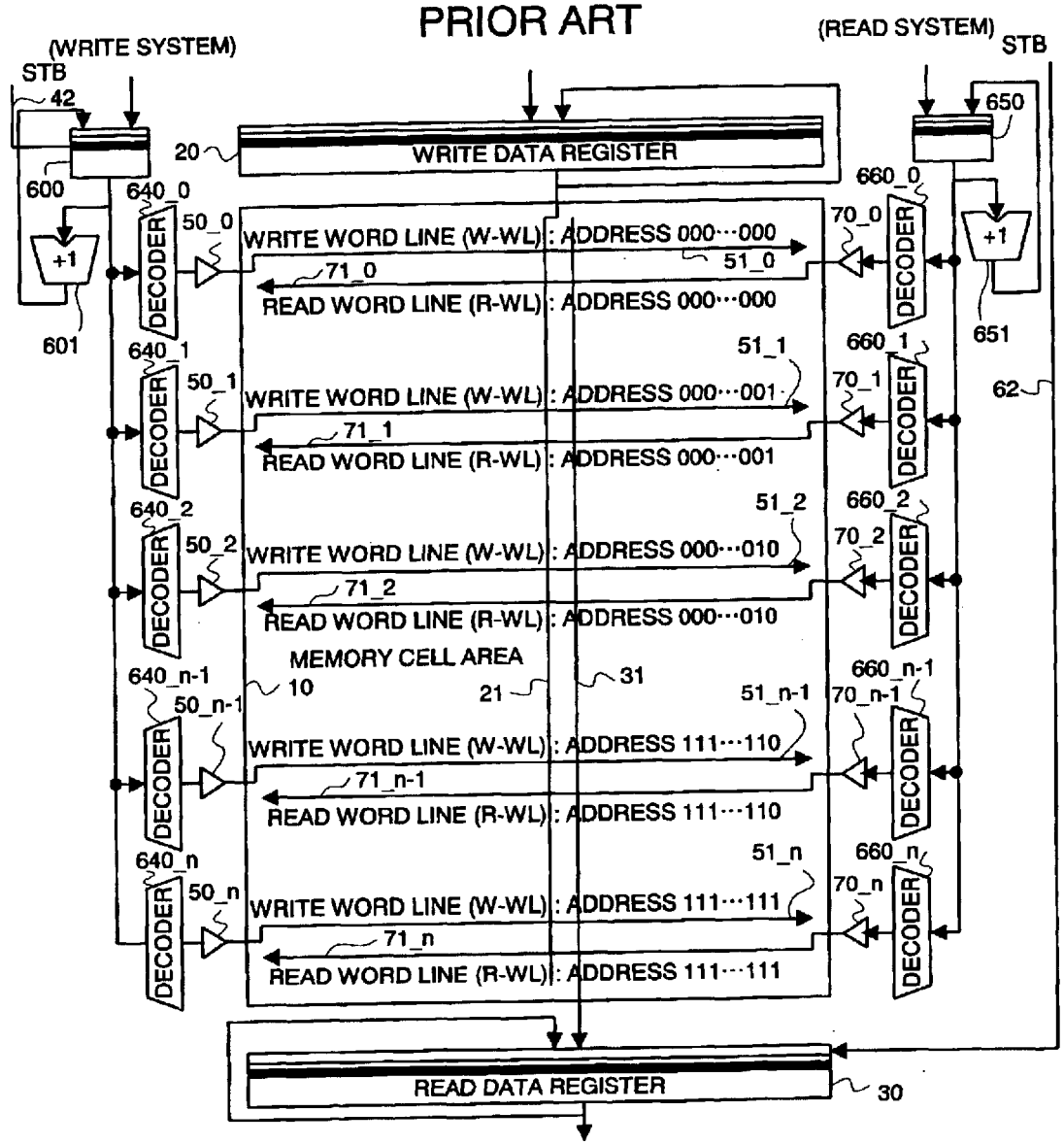
FIG. 6 is a block diagram illustrating a conventional buffer circuit using a two-port RAM.

The above-mentioned configuration is identical to that of the conventional buffer with a two-port RAM shown in FIG. 6. According to the resent invention, registers, each which holds the state of each word line, are prepared. That is, n write word line registers (40_0, 40_1, 40_2, ..., 40_$n$–1, 40_$n$) are arranged to the write port. Similarly, n read word line registers (60_0, 60_1, 60_2, ..., 60_$n$–1, 60_$n$) are arranged to the read port. The output of each of the word line registers is connected directly to a word line driver. The word line driver drives the word line and accesses a memory cell array. That is, n write word line drivers (50_0, 50_1, 50_2, ..., 50_$n$–1, 50_$n$), which are respectively connected to n write word line registers (40_0, 40_1, 40_2, ..., 40_$n$–1, 40_$n$), drive the word lines (51_0, 51_1, 51_2, ..., 51_$n$–1, 51_$n$) in the write port, respectively. Similarly, n read word line drivers (70_0, 70_1, 70_2, ..., 70_$n$–1, 70_$n$), which are respectively connected to n read word line registers (60_0, 60_1, 60_2, ..., 60_$n$–1, 60_$n$), drive the word lines (71_0, 71_1, 71_2, ..., 71_$n$–1, 71_$n$) in the read port, respectively.

All the write word line registers (40_0, 40_1, 40_2, ..., 40_$n$–1, 40_$n$) are cascaded. The write word line registers (40_0, 40_1, 40_2, ..., 40_$n$–1, 40_$n$) are connected in a ring form because the write word line register (40_$n$) corresponding to the most significant address is connected to the write word line register (40_0) corresponding to the least significant address.

The write START signal 41 is input as a synchronous set input to the write word line register (40_0) corresponding to the least significant address. The write START signal 41 is provided as one clock pulse only once during operation.

The write strobe (STB) signal 42 is input to the write word line registers (40_0, 40_1, 40_2, ..., 40_$n$–1, 40_$n$). When the write strobe signal 42 is in active state, each write word line register operates like a shift register. When the write strobe signal 42 is not in active state, all the write word line registers (40_0, 40_1, 40_2, ..., 40_$n$–1, 40_$n$) hold a current value.

The write data register 20 holds a write data value for data writing to a column of memory cells within the memory cell array 10 selected by the word line in an effective selection state, via the bit line 21. As soon as the write strobe signal 42 becomes active, the write data register 20 updates write data.

The read word line registers (60_0, 60_1, 60_2, ..., 60_$n$–1, 60_$n$) are cascaded. The read word line registers (60_0, 60_1, 60_2, ..., 60_$n$–1, 60_$n$) are connected in a ring form such that the read word line register (60_$n$) corresponding to the most significant address is connected to the read word line register (60_0) corresponding to the least significant address.

The read word line register (60_0) corresponding to the least significant address receives the read START signal 61 acting as a synchronous set input. The read START signal 61 is supplied as one clock pulse only once during operation.

A read strobe signal 62 is input to the read word line registers (60_0, 60_1, 60_2, ..., 60_$n$–1, 60_$n$) connected in a ring form. When the read strobe signal 62 is active, the read word line registers (60_0, 60_1, 60_2, ..., 60_n-1, 60_n) operate like a shift register. When the read strobe signal 62 is not active, each of the read word line registers (60_0, 60_1, 60_2, ..., 60_n-1, 60_n) hold a current value.

The read data register 30 holds a read data value acting as read data read out from a memory cell column in the memory cell array 10 selected by a word line in an effective selection state, via the bit line 31. When the read strobe signal 62 is active, the read data register 30 updates the read data.

Figure 2:
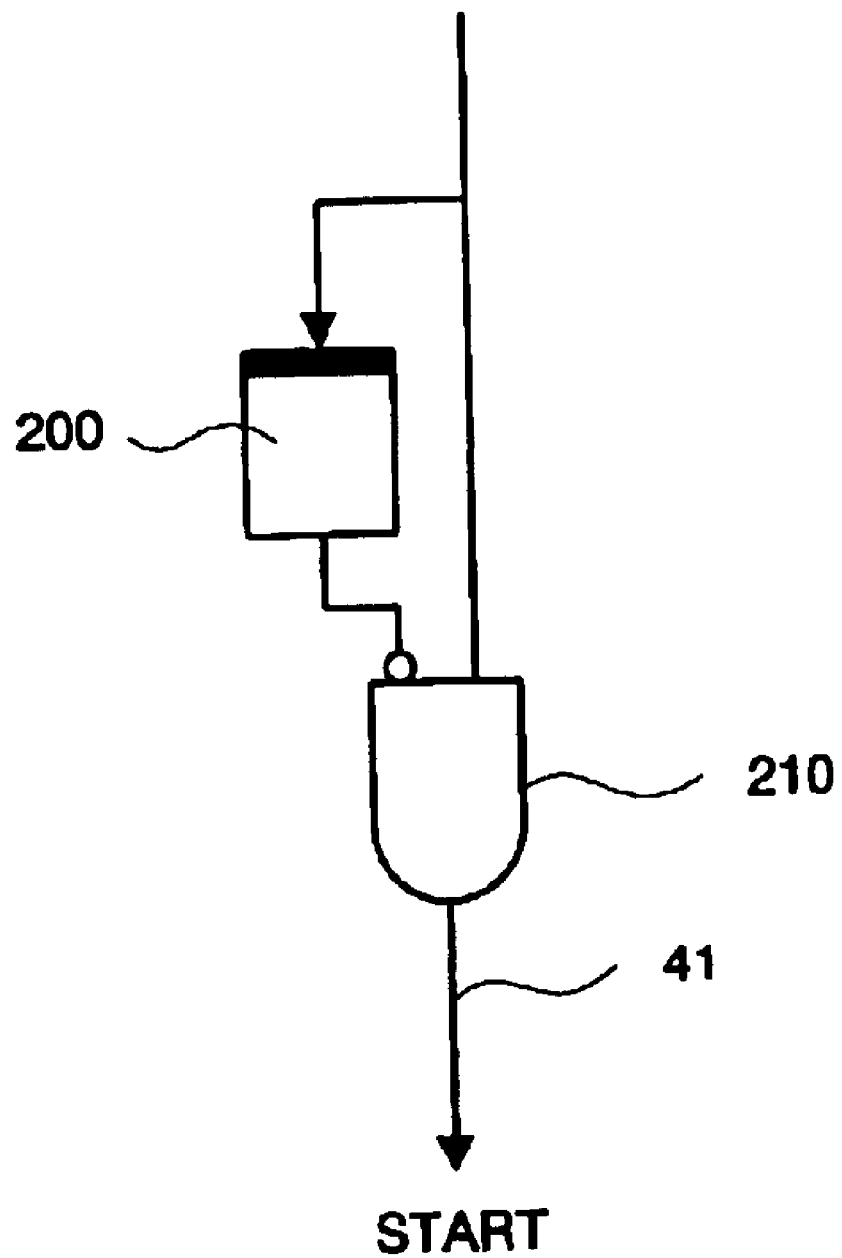
FIG. 2 is a circuit diagram illustrating a leading-edge differentiation circuit according to the first embodiment of the present invention.

FIG. 2 shows an example of a leading edge differentiation circuit that creates the START signal.

As previously described, it is required that the write START signal 41 is one clock pulse and that the read START signal 61 is one clock pulse. The method of detecting the rising of a signal and then differentiating the leading edge thereof is quoted as the simple method of creating one clock pulse. The leading edge differentiation circuit can be simply configured of a register 200 for delaying an input signal by one clock and an AND logic circuit 210 with a negative input.

When the data value before one clock is Low and the current data value is High, the output of the circuit shown in FIG. 2 becomes High. Therefore, rising of the input signal results in High. After the occurrence of one clock, because the delay register 200 outputs a data value of High, the output of the AND logic circuit 210 with the negative input becomes Low. Thus, the START signal 41 becomes one clock pulse in a High state only when the input signal rises. The leading edge differentiation circuit may have any one of various circuit configurations.

The operation of a buffer circuit using a two-port RAM, according to the embodiment of the present invention will be explained below by referring to FIG. 3.

Figure 3:
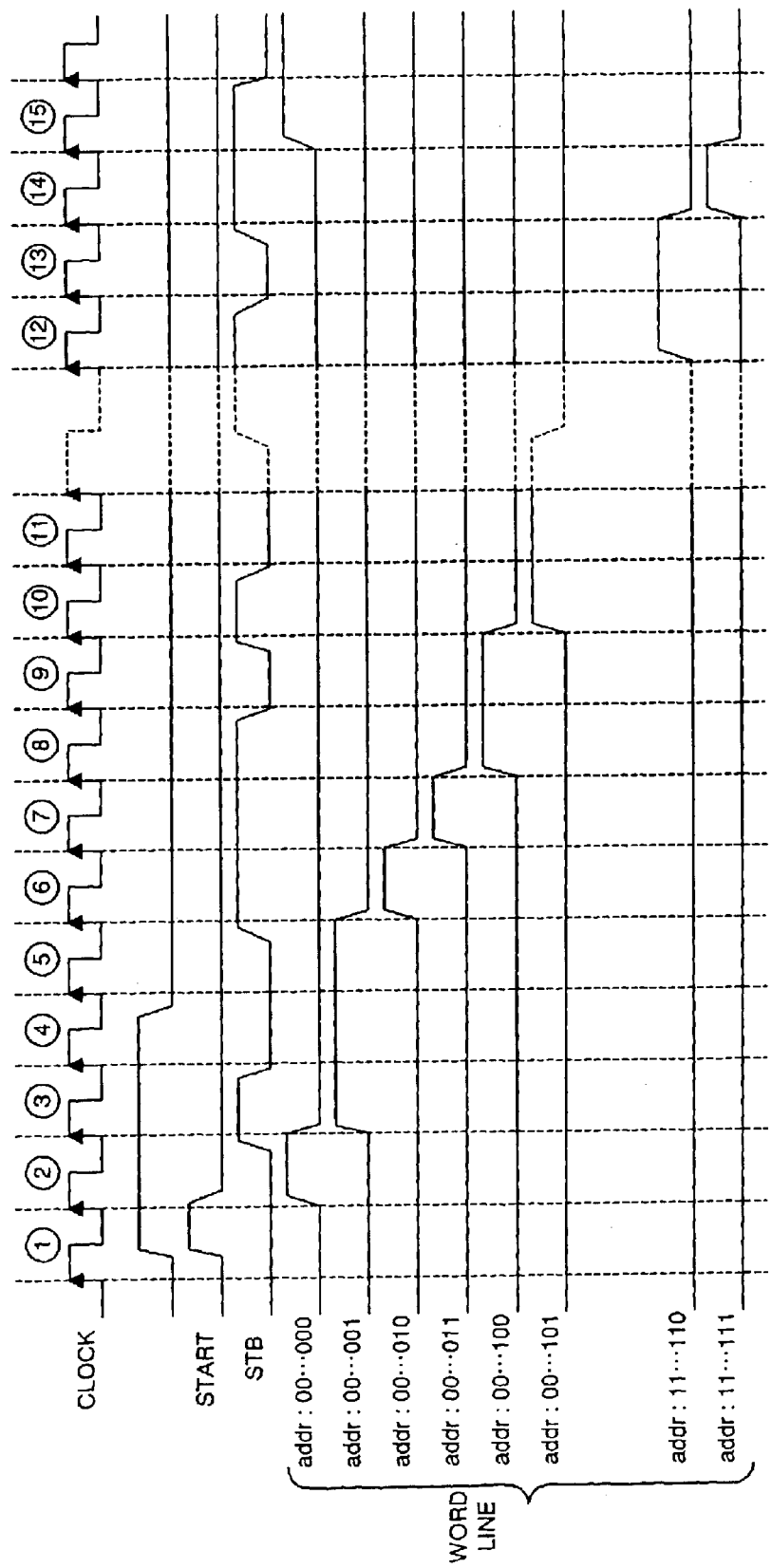
FIG. 3 is a timing chart showing the operation in the first embodiment of the present invention.

Referring to FIG. 3, each of circled numerals represents a period of a clock signal (CLOCK). The operation of the buffer circuit is explained below according to the clock cycles.

FIG. 3 shows only the operation for one port of the buffer circuit. The basic operation of the write port is fundamentally the same as that of the read port. Here, generalized operation will be explained without selecting a specific port.

In the clock cycle ①, the leading edge differentiation circuit (FIG. 2) creates a START signal being one clock cycle pulse. By the way, it is assumed that the strobe signal (STB) behaves suitably for operation but its behavior is not cared practically.

In the clock cycle ②, the word line of the least significant address (labeled as "Addr:000 . . . 00" in FIG. 3) becomes active (a High level) in response to the START signal in the clock cycle ①. In the last half of the clock cycle ② (immediately before the rising edge of the clock in the next clock cycle ③), the strobe signal changes to an active state.

In the clock cycle ③, the word line of the least significant address changes to a non-active state in response to the strobe signal activated in the clock cycle ②. At the same time, the word line ("Addr:000 . . . 01" in FIG. 3) corresponding to the address one higher than the least significant address changes to an active state. In the last half of the clock cycle ③, the strobe signal changes to a non-active state.

In the clock cycle ④, the strobe signal remains the non-active state. For that reason, each word line maintains the previous state represented in the clock cycle ③. The address one higher than the least significant address remains an active state.

The operation in the clock cycle ④ is also the case for that in the clock cycle ⑤. In the last half of the clock cycle ⑤, the strobe signal changes to an active state.

In the clock cycle ⑥, the word line (labeled as Addr:000.01 in FIG. 3) currently in an active state caused by the strobe signal activated in the last half of the clock cycle ⑤ changes to a non-active state. Thus, the word line (labeled as Addr:000 . . . 10 in FIG. 3) corresponding to the address one higher than the least significant address changes to the active state.

Similarly, in the clock cycles ⑦ and ⑧, because the strobe signal is active, the word line activated every clock cycle changes one by one toward upper addresses.

In the clock cycles ⑨ and ⑩, after having once changed to a non-active state, the strobe signal again returns to an active state. Because of that operation, the word line in an active state does not change during the clock cycle ⑨ but changes to the next address during the clock cycle ⑩.

As described above, in the clock cycle during which the strobe signal is active, the word line in active state moves up one address by one address. Thus, the state of the previous clock cycle is maintained in the non-active clock cycle.

That operation resembles the operation where the address is counted up in response to the strobe signal. Meanwhile, the word line in active state is directly shifted to the upper address.

In the clock cycles ⑬ and ⑭, because the strobe signal is activated in the last half of the clock cycle ⑬, the word line in the most significant address (labeled as "Addr: 111 . . . 11" in FIG. 3) becomes active during the clock cycle ⑭. The strobe signal remains an active state even during the clock cycle ⑭.

In the clock cycle ⑮, it is expected that the address is further counted up in response to the strobe signal in the clock cycle ⑭. However, because the word line has reached the most significant address during the clock cycle ⑬, the word line of the most significant address (labeled as "Addr:111 . . . 11" in FIG. 3) during the clock cycle ⑭ returns to a non-active state while the word line of the least significant address (labeled as "Addr:000 . . . 00" in FIG. 3) changes to an active state. This is the peculiar operation of the ring buffer that repeats the count-up operation from the least significant address when the counted-up address reaches the most significant address, and then counts up the address.

Next, the buffer circuit according to the second embodiment of the present invention will be described below by referring to FIG. 4.

Figure 4:
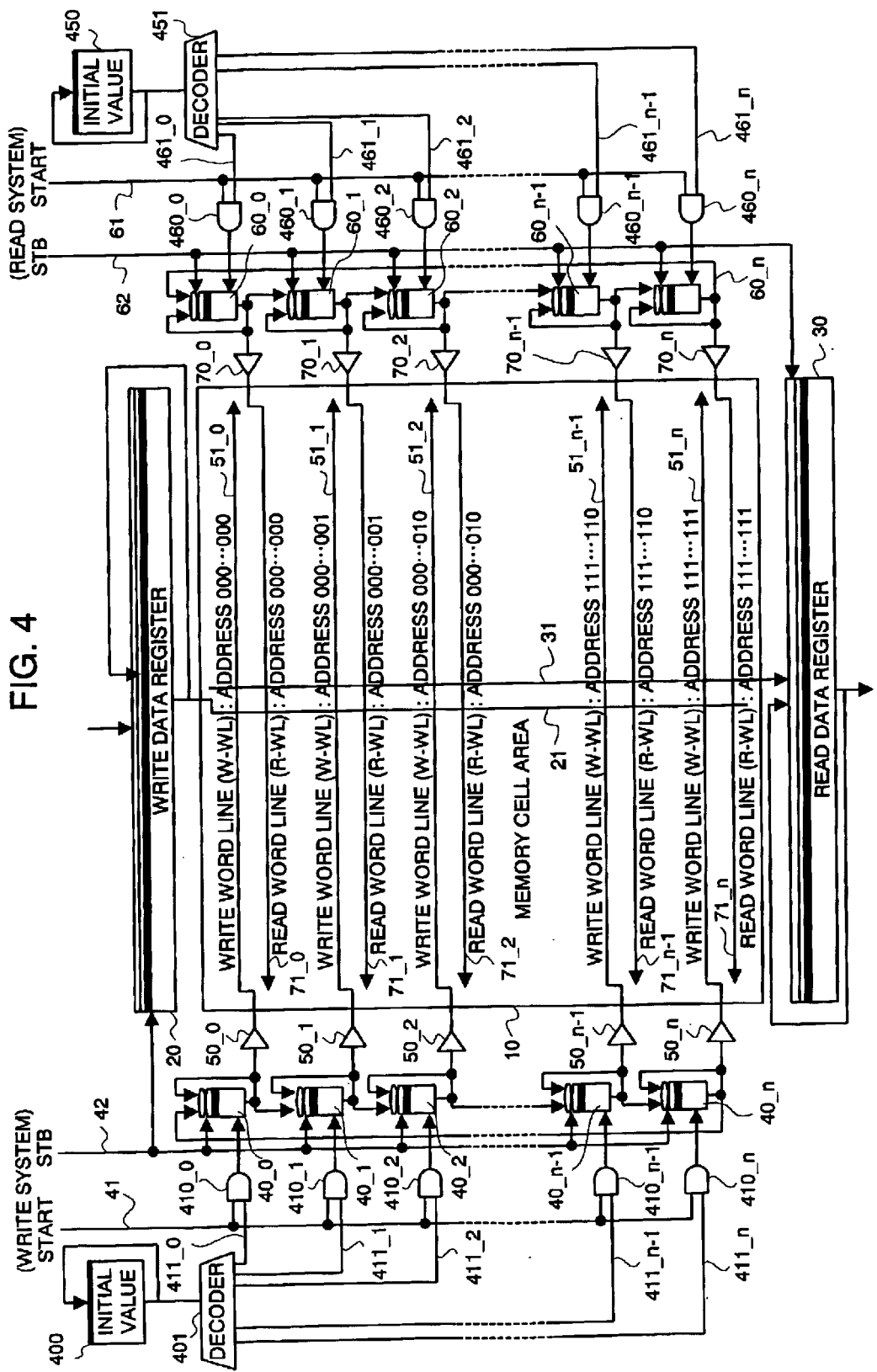
FIG. 4 is a block diagram illustrating a buffer circuit using a two-port RAM, according to a second embodiment of the present invention.

The buffer circuit of FIG. 4 is improved such that the read start address and the write start address can be arbitrarily set initially, without starting from the normal least significant address.

As shown in FIG. 4, the write port includes a write address initial value register 400, a write address initial value decoder 401, and n AND logic circuits (410_0, 410_1, 410_2, . . . , 410_n-1, 410_n).

Similarly, the read port includes a read address initial value register 450, a read address initial value decoder 451, and n AND logic circuits (460_0, 460_1, 460_2, . . . , 460_n-1, 460_n).

The write address initial value register 400 stores a write address initial value.

The write address initial value decoder 401 decodes the write address initial value stored in the write address initial value register 400.

The n AND logic circuits (410_0, 410_1, 410_2, ..., 410_n-1, 410_n) respectively create synchronous set signals to n write word line registers (40_0, 40_1, 40_2, ..., 40_n-1, 40_n) based on the n decode addresses (411_0, 411_1, 411_2, ..., 411_n-1, 411_n) from the write address initial value decoder and based on the write START signal 41.

The read address initial value register 450 stores the read address initial value.

The read address initial value decoder 451 decodes the read address initial value stored in the read address initial value register 450.

n AND logic circuits (460_0, 460_1, 460_2, ..., 460_n-1, 460_n) respectively create synchronous set signals to n read word line registers (60_0, 60_1, 60_2, ..., 60_n-1, 60_n) based on the n decode addresses (461_0, 461_1, 461_2, ..., 461_n-1, 461_n) from the read address initial value decoder and based on the read START signal 61.

Next, the operation of the buffer according to the second embodiment will be described below.

The write address initial value register 400 stores a write address initial value. The write address initial value decoder 401 decodes the write start address initial value set to the write address initial value register 400 and thus activates only one address from among n decode addresses (411_0, 411_1, 411_2, ..., 411_n-1, 411_n). In a manner similar to that of the first embodiment, the write START signal 41 is not set synchronously to the write word line register (40_0) corresponding to the least significant address but is set synchronously to the write word line register corresponding to the decode address activated by the n AND logic circuits (410_0, 410_1, 410_2, ..., 410_n-1, 410_n). This allows the write start address to be arbitrarily changed to the address value set to the write address initial value register 400, without fixing it to the least significant address.

Similarly, in the read port, the read address initial value decoder 451 decodes the read start address initial value set to the read address initial value register 450 and thus activates only one address from among n decode addresses (461_0, 461_1, 461_2, ..., 461_n-1, 461_n). Thereafter, the n AND logic circuits (460_0, 460_1, 460_2, ..., 460_n-1, 460_n) synchronously set the read word line register corresponding to the activated decode address. This allows the read start address to be arbitrarily change to the address value set to the read address initial value register 450, without fixing it to the least significant address.

In most cases, the initial value set to the write address initial value register 400 and the initial value set to the read address initial register 450 are set at the time of system initialization. The initial values are hardly changed dynamically during the system operation. Therefore, the delay time of the write address initial value decoder 401 and the delay time of the read address initial value register 450 are not appear during the system operation and do not adversely affect the access time to memory cells.

Figure 5:
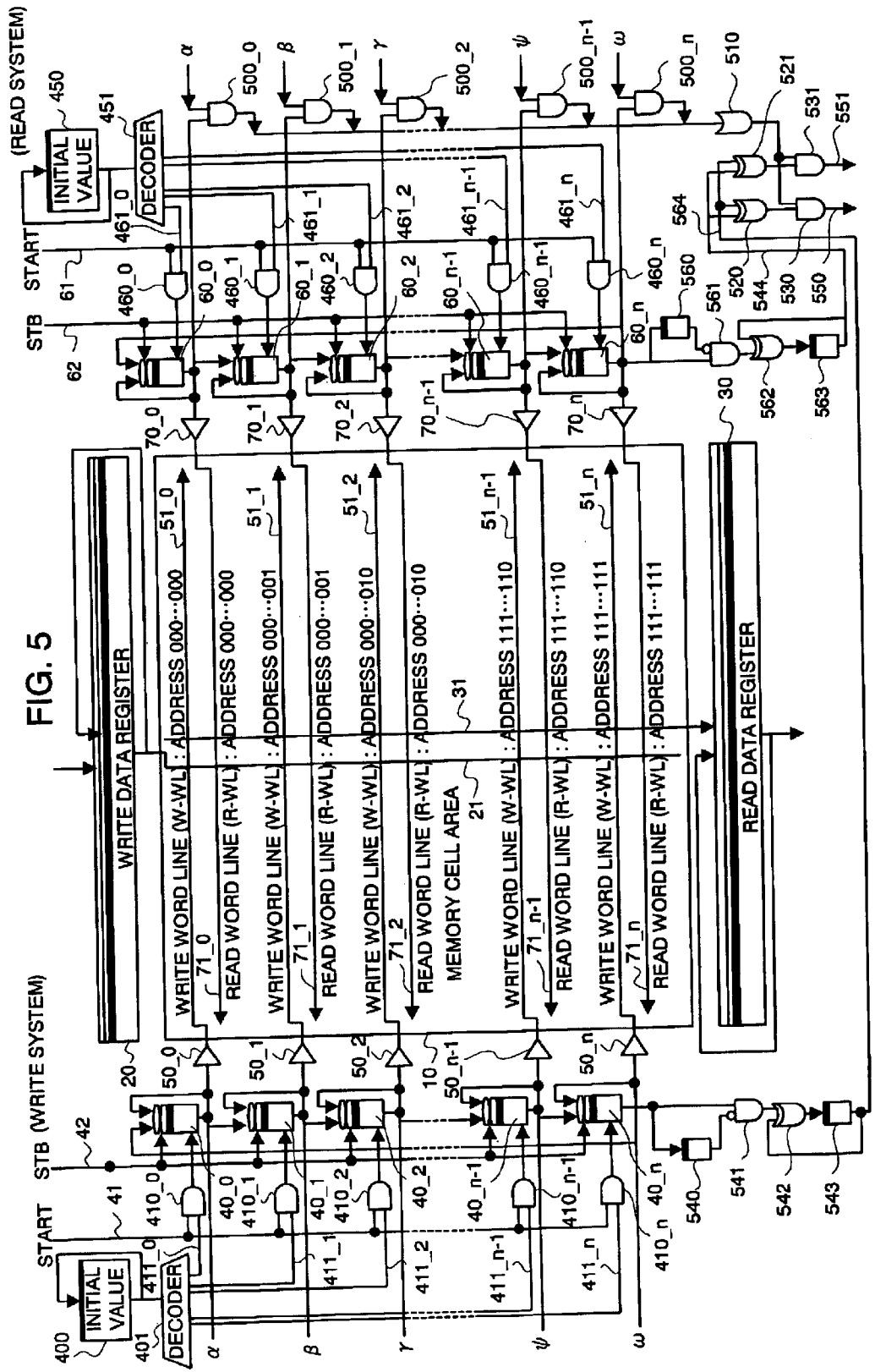
FIG. 5 is a block diagram illustrating a buffer circuit using a two-port RAM, according to a third embodiment of the present invention.

FIG. 5 shows a buffer circuit with a two-port RAM according to the third embodiment of the present invention.

In the third embodiment, the detector that detects an occurrence of exceptional phenomenon is added to the configuration of the second embodiment. The exceptional phenomenon includes a buffer overflow occurring when a write address overtakes a read address or a buffer underflow occurring when a read address overtakes a write address.

As shown in FIG. 5, an OR logic circuit 510, an exclusive OR logic circuit 520, an exclusive NOR logic circuit 521, AND logic circuits 530 and 531, a delay register 540, an AND logic circuit with a negative input 541, an exclusive OR logic circuit 542, flag registers 543 and 563, a delay register 560, an AND logic circuit with a negative input 561, an exclusive OR logic circuit 562, and n AND logic circuits (500_0, 500_1, 500_2, ..., 500_n-1, 500_n).

The combination of the delay register 540 and the AND logic circuit 541 with a negative input corresponds to a leading edge differentiation circuit that detects the rising of the write word line register (40_n) of the most significant address in an active state and then creates one clock pulse.

The exclusive OR logic circuit 542 creates a write address carry flag based on one clock pulse created by the combination of the delay register 540 and the AND logic circuit 541 with a negative input.

The combination of the delay register 560 and the AND logic circuit 561 with a negative input corresponds to a leading edge differentiation circuit that detects the rising of the read word line register (60_n) of the most significant address in an active state and then creates one clock pulse.

The exclusive OR logic circuit 562 creates a read address carry flag based on one clock pulse.

n AND logic circuits (500_0, 500_1, 500_2, ..., 500_n-1, 500_n) detect whether or not the values held in n write word line registers (40_0, 40_1, 40_2, ..., 40_n-1, 40_n) coincide with the values held in n read word line registers (60_0, 60_1, 60_2, ..., 60_n-1, 60_n), respectively.

The OR logic circuit 510 detects whether or not any one of the n AND logic circuits (500_0, 500_1, 500_2, 500_n-1, 500_n) holds a coincidence result.

The exclusive OR logic circuit 520 decides whether or not the write address carry flag of the flag register 543 coincides with the read address carry flag of the flag register 563.

When the exclusive OR logic circuit 520 decides that the write address carry flag does not coincide with the read address carry flag and the OR logic circuit 510 detects a coincidence result, the AND logic circuit 530 detects the buffer overflow 550.

The exclusive NOR logic circuit 521 decides whether or not the write address carry flag of the flag register 543 coincides with the read address carry flag of the flag register 563.

When the exclusive NOR logic circuit 521 decides that the write address carry flag coincides with the read address carry flag and the OR logic circuit 510 detects a coincidence result, the AND logic circuit 531 detects the buffer underflow 551.

Next, the operation of the buffer according to a third embodiment will be described below.

The exclusive OR logic circuit 520 decides whether or not the write address carry flag of the flag register 543 coincides with the read address carry flag of the flag resister 563. Moreover, the exclusive OR logic circuit 520 transmits a non-coincidence signal to the AND logic circuit 530 when deciding that the write address carry flag does not coincide with the read address carry flag.

In response to a non-coincidence signal from the exclusive OR logic circuit 520 and a coincidence signal from the OR logic circuit 510, the AND logic circuit 530 detects the buffer overflow 550.

In a manner similar to that of the exclusive OR logic circuit 520, the exclusive NOR logic circuit 521 decides whether or not the write address carry flag of the flag register 543 coincides with the read address carry flag of the flag resister 563. When deciding that the write address carry flag of the flag register 543 coincides with the read address carry flag of the flag resister 563, the exclusive NOR logic circuit 521 transmits a coincidence signal to the AND logic circuit 531.

When the exclusive NOR logic circuit 521 and the OR logic circuit 510 transmit coincidence signals respectively, the AND logic circuit 531 detects the buffer underflow 551.

As described above, according to the present invention, the read address and the write address utilize the operational characteristics of the buffer which counts up based on the strobe signal, thus optimizing the circuits for driving the word lines within the RAM. Thus, the address decoder (required in the conventional art), provided from the address register to the word line drive buffer, is removed. The improved configuration can speed up the access time of the buffer with a two-port RAM and can reduce the power consumption.

The entire disclosure of Japanese Patent Application No. 2002-003964 filed on Jan. 10, 2002 including specification, claims, drawings and summary are incorporated herein by reference in its entirely.

What is claimed is:

1. A buffer using a two-port memory, comprising:
   a memory cell array formed of memory cells arranged two-dimensionally in a matrix form;
   a plurality of write-word lines arranged corresponding to a write address;
   a plurality of read-word lines arranged corresponding to a read address;
   a plurality of write bit lines arranged corresponding to write data;
   a plurality of read bit lines arranged corresponding to read data;
   a plurality of word line registers arranged corresponding to either said write word lines or said read word lines;
   a plurality of word line drivers respectively connected directly to outputs of said word line registers, for respectively driving said word lines;
   a write data register connected to said write bit lines; and
   a read data register connected to said read bit line;
   said word line registers being mutually cascaded in a ring form, to receive a strobe signal;
   whereby each of said word line registers counts up its input when the strobe signal is in an active state and holds a current value when said strobe signal is not in an active state.

2. A buffer using a two-port memory, comprising:
   a memory cell array formed of memory cells arranged two-dimensionally in a matrix form;
   a plurality of write-word lines arranged corresponding to a write address;
   a plurality of read-word lines arranged corresponding to a read address;
   a plurality of write bit lines arranged corresponding to write data;
   a plurality of read bit lines arranged corresponding to read data;
   a plurality of write word line registers arranged corresponding to said write word lines;
   a plurality of read word line registers arranged corresponding to said read word lines;
   a plurality of write word line drivers for directly receiving outputs of said write word line registers, for driving said write word lines;
   a plurality of read word line drivers for directly receiving outputs of said read word line registers and driving said read word lines;
   a write data register connected to said write bit lines; and
   a read data register connected to said read bit line;
   said write word line registers being mutually cascaded in a ring form, to receive a write strobe signal;
   whereby each of said write word line registers counts up an input when the write strobe signal is in an active state and holds a current value when said write strobe signal is not in an active state;
   said read word line registers being mutually cascaded in a ring form, to receive a read strobe signal;
   whereby each of said read word line registers counts up an input when the read strobe signal is in an active state and holds a current value when said read strobe signal is not in an active state.

3. The buffer defined in claim 2, wherein said write strobe signal is used to controllably update said write data register; and wherein said read strobe signal is used to controllably update said read data register; and wherein said write data register updates write data when said write strobe signal is in an active state; and wherein said read data register updates read data when said read strobe signal is in an active state; and wherein said write data register hold a current value when said write strobe signal is not in an active state; and wherein said read data register hold a current value when said read strobe signal is not in an active state.

4. The buffer defined in claim 3, wherein a write word line register corresponding to a specific address receives a write START signal as a synchronous set input; and wherein a read word line register corresponding to a specific address receives a read START signal as a synchronous set input.

5. The buffer defined in claim 3, further comprising:
   a write address initial value register for storing a write address initial value;
   a write address initial value decoder for decoding a write address initial value stored in said write address initial value register;
   a plurality of AND logic circuits for creating a synchronous set signal to said write word line register in accordance with plural decode addresses from said write address initial value decoder and in accordance with a write START signal;
   a read address initial value register for storing a read address initial value;
   a read address initial value decoder for decoding a read address initial value stored in said read address initial value register; and
   a plurality of AND logic circuits for creating a synchronous set signal to said read word line register in accordance with plural decode addresses from said read address initial value decoder and in accordance with a read START signal.

6. The buffer defined in claim 5, further comprising:
   a write delay register, which forms a leading edge differentiation circuit, for detecting rising when a write word line register of a most significant address is in an active state and then creating one clock pulse;

an AND logic circuit with write negative inputs, having an inversion input terminal which receives an output of said write delay register and a normal input terminal which receives an output of said write word line register of said most significant address;

a write exclusive OR logic circuit forming a write address carry flag for toggling one clock pulse as an input;

a write flag register for receiving an output of said write exclusive OR logic circuit;

a read delay register forming a leading edge differentiation circuit that detects rising when a read word line register of the most significant address becomes an active state and then creates one clock pulse;

an AND logic circuit with read negative inputs, having an inversion input terminal for receiving an output of said read delay register and a normal input terminal for receiving an output of said read word line register of the most significant address;

a read exclusive OR logic circuit forming a read address carry flag toggling one clock pulse as an input;

a read flag register for receiving an output of said read exclusive OR logic circuit;

a plurality of coincidence detection AND logic circuits each for detecting whether or not a value held in each write word line register coincides with a value held in each read word line register;

an OR logic circuit for detecting whether or not there is a coincidence result in any one of said coincidence detection AND logic circuit;

an exclusive OR logic circuit and an AND logic circuit, for detecting a buffer overflow when a write address carry flag is not in coincident with a read address carry flag and when said OR logic circuit produces a coincidence result; and an exclusive NOR logic circuit and an AND logic circuit, for detecting a buffer underflow when a write address carry flag is in coincident with a read address carry flag and when said OR logic circuit produces a coincidence result.

7. The buffer defined in claim 2, wherein a write word line register corresponding to a specific address receives a write START signal as a synchronous set input; and wherein a read word line register corresponding to a specific address receives a read START signal as a synchronous set input.

8. The buffer defined in claim 2, further comprising:
a write address initial value register for storing a write address initial value;
a write address initial value decoder for decoding a write address initial value stored in said write address initial value register;
a plurality of AND logic circuits for creating a synchronous set signal to said write word line register in accordance with plural decode addresses from said write address initial value decoder and in accordance with a write START signal;
a read address initial value register for storing a read address initial value;
a read address initial value decoder for decoding a read address initial value stored in said read address initial value register; and
a plurality of AND logic circuits for creating a synchronous set signal to said read word line register in accordance with plural decode addresses from said read address initial value decoder and in accordance with a read START signal.

9. A buffer using a two-port memory, comprising:
a memory cell array formed of memory cells arranged two-dimensionally in a matrix form;
a plurality of write word lines arranged corresponding to a write address;
a plurality of read word lines arranged corresponding to a read address;
a plurality of write bit lines arranged corresponding to write data;
a plurality of read bit lines arranged corresponding to read data;
a plurality of write word line registers arranged corresponding to said write word lines, for counting up an input based on a write strobe signal;
a plurality of read word line registers arranged corresponding to said read word lines, for counting up an input based on a read strobe signal;
a plurality of write word line drivers for driving said write word lines based on output signals from said write word line registers;
a plurality of read word line drivers for driving said read word lines based on output signals from said read word line registers;
a write data register for updating write data when said write strobe signal is active and for holding a current value when said write strobe signal is not active; and
a read data register for updating read data when said read strobe signal is active and for holding a current value when said read strobe signal is not active.

10. The buffer defined in claim 9, wherein a write word line register corresponding to a predetermined address receives a write START signal as a synchronous set input; and wherein a read word line register corresponding to a predetermined address receives a read START signal as a synchronous set input.

11. The buffer defined in claim 9, further comprising:
a write address initial value register for storing a write address initial value;
a write address initial value decoder for decoding a write address initial value stored in said write address initial value register;
a plurality of AND logic circuits for creating a synchronous set signal to said write word line register in accordance with a signal from said write address initial value decoder and in accordance with a write START signal;
a read address initial value register for storing a read address initial value;
a read address initial value decoder for decoding a read address initial value stored in said read address initial value register; and
a plurality of AND logic circuits for creating a synchronous set signal to said read word line register in accordance with a signal from said read address initial value decoder and in accordance with a read START signal.

12. The buffer defined in claim 9, further comprising:
a clock pulse creation circuit in the write system, for detecting rising when a write word line register of a most significant address becomes an active state and then creating one clock pulse;
a write exclusive OR logic circuit for creating a write address carry flag based on one clock pulse created by said clock pulse creation circuit in the write system;

a write flag register for receiving an output signal of said write exclusive OR logic circuit;

a clock pulse creation circuit in the read system, for detecting rising when a read word line register of the most significant address becomes an active state and then creating one clock pulse;

a read exclusive OR logic circuit for creating a read address carry flag based on one clock pulse created by said clock pulse creation circuit in the read system;

a read flag register for receiving an output signal of said read exclusive OR logic circuit;

a plurality of coincidence detection AND logic circuits for detecting whether or not a value held in each write word line register coincides with a value held in each read word line register;

an OR logic circuit for detecting whether or not there is a coincidence result in any one of said coincidence detection AND logic circuit;

an exclusive OR logic circuit and an AND logic circuit, for detecting a buffer overflow when a write address carry flag is not in coincident with a read address carry flag and when said OR logic circuit produces a coincidence result; and an exclusive NOR logic circuit and an AND logic circuit, for detecting a buffer underflow when a write address carry flag is in coincident with a read address carry flag and when said OR logic circuit produces a coincidence result.

* * * * *